(12) United States Patent
Kadoguchi et al.

(10) Patent No.: US 9,312,211 B2
(45) Date of Patent: Apr. 12, 2016

(54) SEMICONDUCTOR DEVICE AND MANUFACTURING METHOD THEREOF

(71) Applicants: Takuya Kadoguchi, Toyota (JP); Shingo Iwasaki, Nisshin (JP); Akira Mochida, Nagoya (JP); Tomomi Okumura, Chiryu (JP)

(72) Inventors: Takuya Kadoguchi, Toyota (JP); Shingo Iwasaki, Nisshin (JP); Akira Mochida, Nagoya (JP); Tomomi Okumura, Chiryu (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/383,316

(22) PCT Filed: Feb. 28, 2013

(86) PCT No.: PCT/JP2013/055523
§ 371 (c)(1),
(2) Date: Sep. 5, 2014

(87) PCT Pub. No.: WO2013/133134
PCT Pub. Date: Sep. 12, 2013

(65) Prior Publication Data
US 2015/0028466 A1 Jan. 29, 2015

(30) Foreign Application Priority Data
Mar. 7, 2012 (JP) .................................. 2012-050992

(51) Int. Cl.
*H01L 23/495* (2006.01)
*H01L 23/31* (2006.01)
(Continued)

(52) U.S. Cl.
CPC ........ *H01L 23/49575* (2013.01); *H01L 23/051* (2013.01); *H01L 23/3107* (2013.01);
(Continued)

(58) Field of Classification Search
CPC .................................................. H01L 23/49537
USPC .......................................... 257/713; 438/138
See application file for complete search history.

(56) References Cited

U.S. PATENT DOCUMENTS 7,230,273 B2 * 6/2007 Kitabatake et al. ................. H01L 23/49562
257/76
7,423,342 B2 * 9/2008 Hino et al. ............. G09B 23/18
257/706
2001/0033477 A1 10/2001 Inoue et al.
(Continued)

FOREIGN PATENT DOCUMENTS

JP A-2002-270736 9/2002
JP A-2005-123495 5/2005
(Continued)

*Primary Examiner* — Chandra Chaudhari
(74) *Attorney, Agent, or Firm* — Oliff PLC

(57) ABSTRACT

The present invention relates to a semiconductor device and a manufacturing method thereof. The semiconductor device has a plurality of power units placed in parallel in a predetermined direction, wherein each of the power units includes a plurality of semiconductor elements placed on a metal plate having predetermined gaps with each other. The semiconductor elements of each of the two power units include a near-sided semiconductor element that is closer to an inlet of the resin among the two semiconductor elements having the predetermined gap therebetween. A structure is positioned on a passage and downstream in a resin flow direction relative to a predetermined position that corresponds to end parts of the near-sided semiconductor elements. The structure is a joint to connect the two power units placed adjacent to each other in the predetermined direction, and to be integrally sealed with the resin, along with the power unit.

15 Claims, 11 Drawing Sheets

(51) Int. Cl.
*H01L 23/498* (2006.01)
*H01L 23/051* (2006.01)
*H01L 25/18* (2006.01)

(52) U.S. Cl.
CPC ........ *H01L23/498* (2013.01); *H01L 23/49537* (2013.01); *H01L 23/49562* (2013.01); *H01L 23/49833* (2013.01); *H01L 23/49844* (2013.01); *H01L 23/49861* (2013.01); *H01L 23/49513* (2013.01); *H01L 23/49541* (2013.01); *H01L 25/18* (2013.01); *H01L 2224/29111* (2013.01); *H01L 2224/32245* (2013.01); *H01L 2224/33181* (2013.01); *H01L 2224/45124* (2013.01); *H01L 2224/45147* (2013.01); *H01L 2224/48247* (2013.01); *H01L 2224/73215* (2013.01); *H01L 2224/73265* (2013.01); *H01L 2924/01047* (2013.01); *H01L 2924/1301* (2013.01); *H01L 2924/1305* (2013.01); *H01L 2924/13055* (2013.01); *H01L 2924/1815* (2013.01)

(56) References Cited

U.S. PATENT DOCUMENTS

| | | |
|---|---|---|
| 2008/0073358 A1 | 3/2008 | Jeuch et al. |
| 2012/0087095 A1 | 4/2012 | Tokuyama et al. |
| 2013/0021749 A1 | 1/2013 | Nakajima |
| 2013/0062751 A1 | 3/2013 | Takagi et al. |
| 2013/0128643 A1 | 5/2013 | Shinohara et al. |
| 2014/0035112 A1 | 2/2014 | Kadoguchi et al. |

FOREIGN PATENT DOCUMENTS

| | | |
|---|---|---|
| JP | A-2006-120970 | 5/2006 |
| JP | A-2007-43204 | 2/2007 |
| JP | A-2007-68302 | 3/2007 |
| JP | B2-4192396 | 12/2008 |
| JP | A-2009-135515 | 6/2009 |
| JP | A-2010-258315 | 11/2010 |
| JP | A-2011-217548 | 10/2011 |
| JP | A-2011-233606 | 11/2011 |
| JP | A-2012-235081 | 11/2012 |
| WO | WO 2011/162241 A1 | 12/2011 |

\* cited by examiner

SEMICONDUCTOR DEVICE AND MANUFACTURING METHOD THEREOF

TECHNICAL FIELD

The present invention relates to a semiconductor device and a manufacturing method thereof, especially, a semiconductor device that is suitable to have multiple power units configured to be placed in parallel in a predetermined direction, and integrally sealed with resin, wherein each of the power units includes multiple semiconductor elements placed on a metal plate having predetermined gaps with each other.

BACKGROUND ART

Conventionally, a semiconductor device has been known that includes a power unit in which two types of semiconductor elements are placed on a metal plate having a predetermined gap between them (see; for example, Patent Document 1). In the semiconductor device, the power unit includes a power transistor (IGBT) and a freewheeling diode that are connected in parallel with each other, as the two types of semiconductor elements. In the power unit, the power transistor and the freewheeling diode are placed in parallel in a first direction on the metal plate, and sealed by resin as a whole.

Also, multiple power units are provided in the semiconductor device, placed in parallel having predetermined gaps. Specifically, the power units are arranged in a second direction perpendicular to the first direction where the power transistors and the freewheeling diodes are arranged, and the power units are sealed by resin as a whole.

RELATED-ART DOCUMENTS

Patent Documents

[Patent Document 1] Japanese Laid-open Patent Publication No. 2010-258315

SUMMARY OF THE INVENTION

Problem to be Solved by Invention

Incidentally, during a manufacturing stage of the semiconductor device (when molding is performed), if resin is injected from one side of the power units placed in parallel in the second direction (specifically, the side at which signal wires are connected with the power units) to the other side, the resin flows between two adjacent power units, and between the power units and a die that exist in the second direction relative to the power units, and then, flows into the gap between the power transistors and the freewheeling diodes arranged in the first direction. In this case, if the resin is confluent at the gap between the power transistor and the freewheeling diode in each power unit, likelihood is high in that resin void and resin delamination are generated at the location. Especially, in a structure where radiators are provided on both surfaces of the semiconductor element, it is difficult to make air flow through the resin confluent location, and hence, resin void and resin delamination tend to be generated.

The present invention is made in view of the above, and has an object to provide a semiconductor device and its manufacturing method which can suppress generation of resin void, by making it hard to generate resin confluence between multiple semiconductor elements in the power units when molding is performed.

Means to Solve the Problem

According to an embodiment of the present invention, a semiconductor device includes a plurality of power units configured to be placed in parallel in a predetermined direction, and integrally sealed with resin, wherein each of the power units includes a plurality of semiconductor elements placed on a metal plate having predetermined gaps with each other. Two of the power units placed adjacent to each other in the predetermined direction have a passage therebetween through which the resin flows injected during manufacturing. The semiconductor elements of each of the two power units include a near-sided semiconductor element that is closer to an inlet of the resin among the two semiconductor elements having the predetermined gap therebetween. A structure is positioned on a passage and downstream in a resin flow direction relative to a predetermined position that corresponds to end parts of the near-sided semiconductor elements such that the structure prevents the resin from flowing downstream in a resin flow direction, the end parts being on a side opposite to another side closer to the inlet. The structure is a joint to connect the two power units placed adjacent to each other in the predetermined direction, and to be integrally sealed with the resin, along with the power unit.

According to an embodiment of the present invention, a semiconductor device includes a plurality of power units configured to be placed in parallel in a predetermined direction, and integrally sealed with resin, wherein each of the power units includes a plurality of semiconductor elements placed on a metal plate having predetermined gaps with each other. Two of the power units placed adjacent to each other in the predetermined direction have a passage therebetween through which the resin flows injected during manufacturing. The semiconductor elements of each of the two power units include a near-sided semiconductor element that is closer to an inlet of the resin among the two semiconductor elements having the predetermined gap therebetween. A structure is positioned on a passage and downstream in a resin flow direction relative to a predetermined position that corresponds to end parts of the near-sided semiconductor elements such that the structure prevents the resin from flowing downstream in a resin flow direction, the end parts being on a side opposite to another side closer to the inlet. The structure is a far-sided semiconductor element positioned on a far side from the inlet, disposed to project in the predetermined direction from the end part of the near-sided semiconductor element in the predetermined direction.

According to an embodiment of the present invention, a manufacturing method of a semiconductor device includes a plurality of power units configured to be placed in parallel in a predetermined direction, and integrally sealed with resin, wherein each of the power units includes a plurality of semiconductor elements placed on a metal plate having predetermined gaps with each other, wherein two of the power units placed adjacent to each other in the predetermined direction have a passage therebetween through which the resin flows injected during manufacturing, wherein the semiconductor elements of each of the two power units include a near-sided semiconductor element that is closer to an inlet of the resin among the two semiconductor elements having the predetermined gap therebetween, the method includes placing a joint as a structure on the passage to prevent the resin from flowing downstream in a resin flowing direction, wherein the structure is positioned downstream in the resin flowing direction relative to a predetermined position corresponding to an end part on a side opposite to another side closer to the inlet of the near-sided semiconductor element, wherein the joint is to connect the two power units placed adjacent to each other in the predetermined direction, and to be integrally sealed with resin, along with the power unit; and injecting the resin.

According to an embodiment of the present invention, a manufacturing method of a semiconductor device includes a plurality of power units configured to be placed in parallel in a predetermined direction, and integrally sealed with resin, wherein each of the power units includes a plurality of semiconductor elements placed on a metal plate having predetermined gaps with each other, wherein two of the power units placed adjacent to each other in the predetermined direction have a passage therebetween through which the resin flows injected during manufacturing, the method includes placing a joint on the passage so that an end part on a side of the inlet of the structure is positioned in a positional range corresponding to the predetermined gap, wherein the joint is to connect the two power units placed adjacent to each other in the predetermined direction, and to be integrally sealed with the resin, along with the power unit; and injecting the resin.

Advantage of the Invention

According to at least one of the embodiments of the present invention, it is possible to suppress generation of resin void, by making it hard to generate resin confluence between multiple semiconductor elements in the power units when molding is performed.

MODE FOR CARRYING OUT THE INVENTION

In the following, embodiments of semiconductor devices and their manufacturing methods will be described with reference to the drawings according to the present invention.

Figure 1:
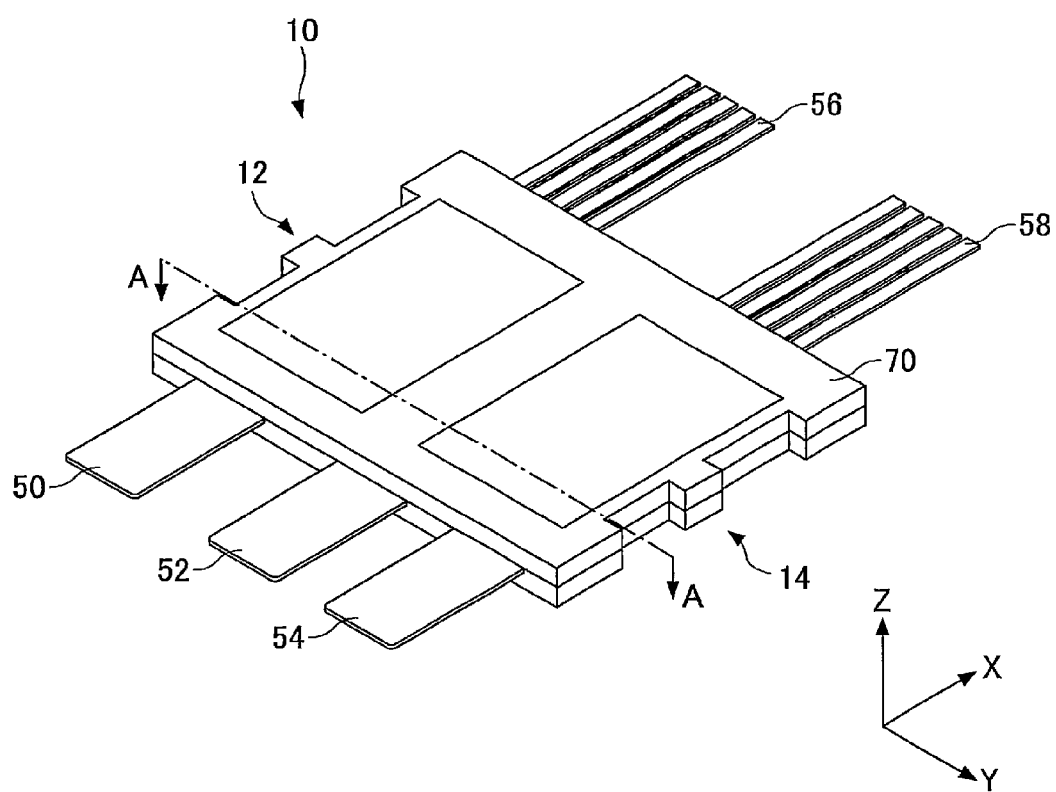
FIG. 1 is an external view of a semiconductor device according to an embodiment of the present invention.
Figure 2:
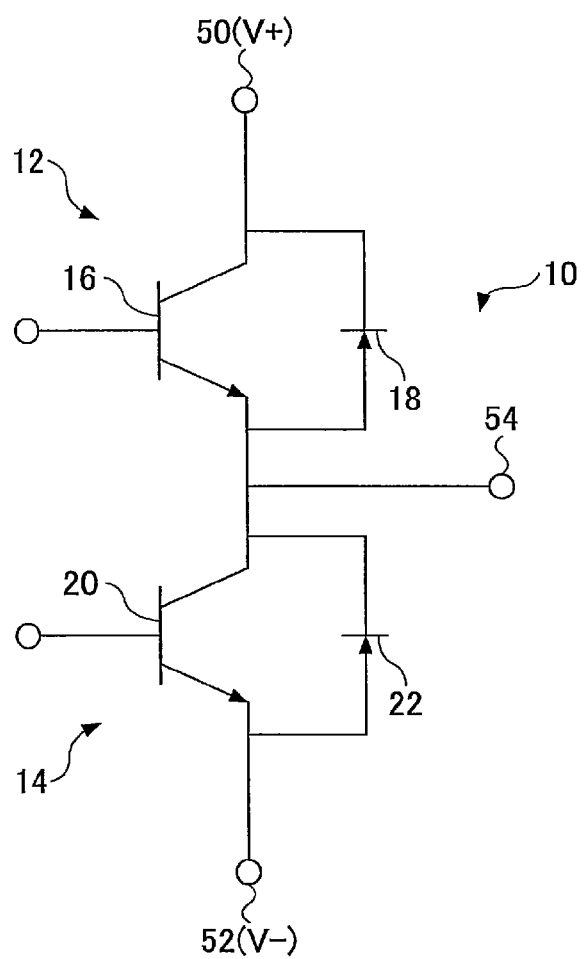
FIG. 2 is a circuit configuration diagram of a semiconductor device in the present embodiment.
Figure 3:
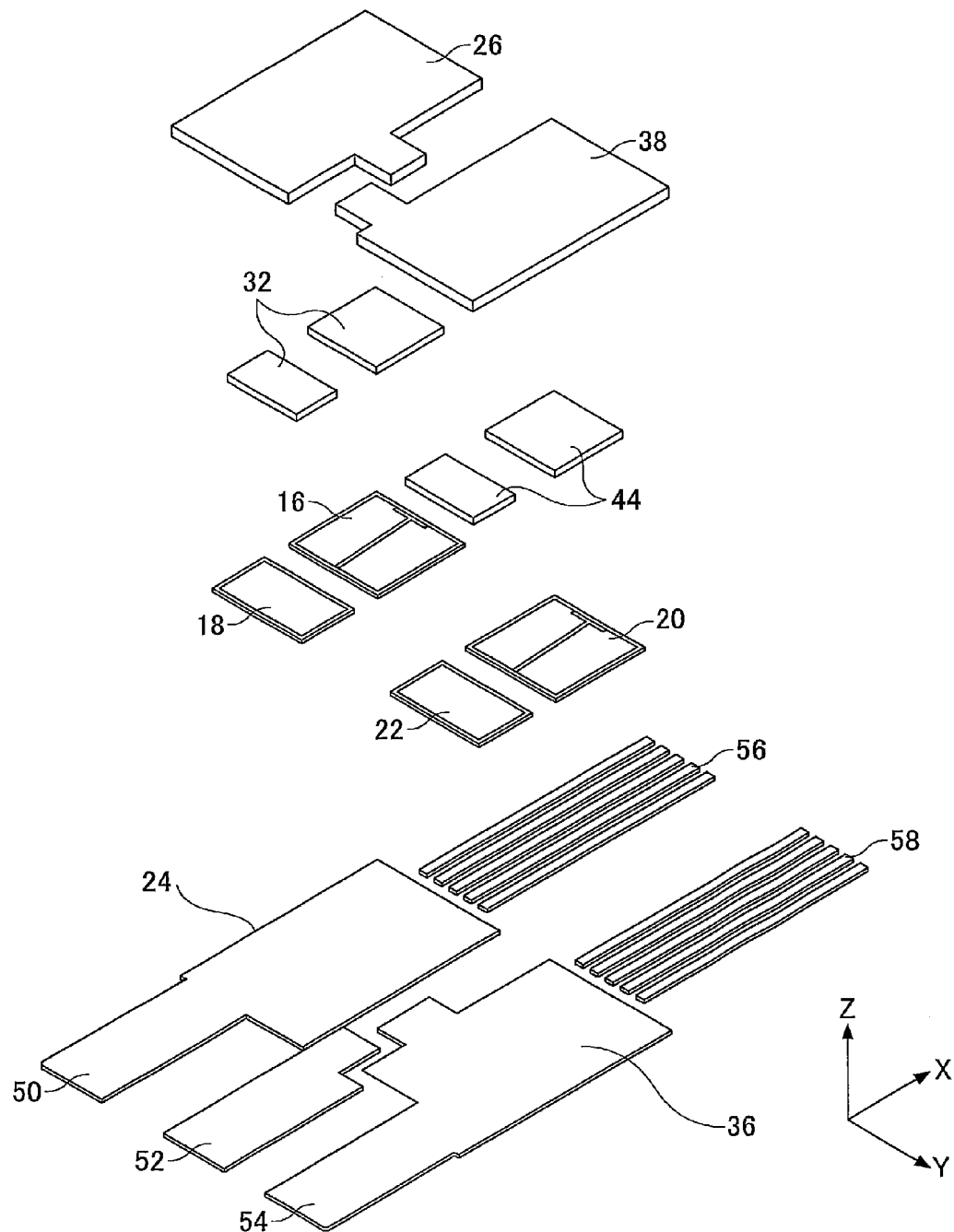
FIG. 3 is an exploded view of the semiconductor device illustrated in FIG. 1.
Figure 4:
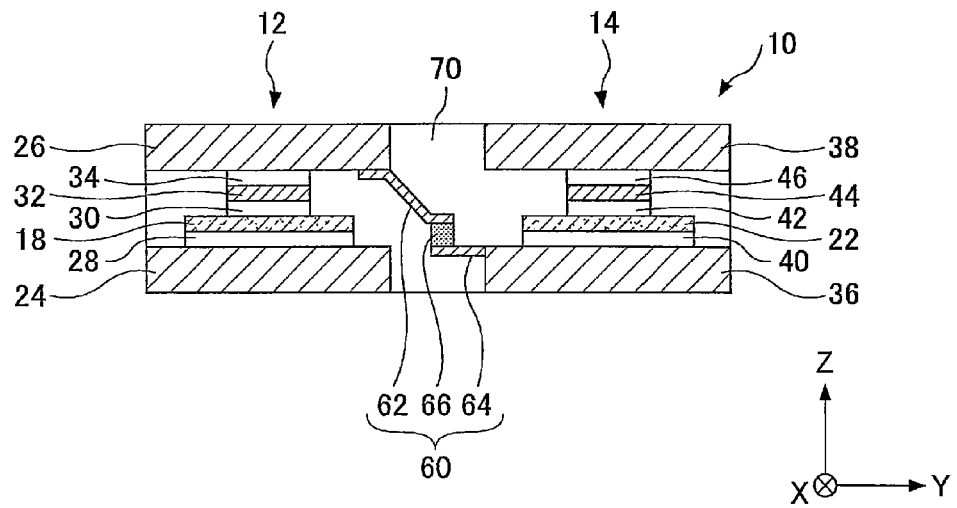
FIG. 4 is a cross-sectional view of the semiconductor device according to the present embodiment, taken along a line A-A illustrated in FIG. 1.
Figure 5:
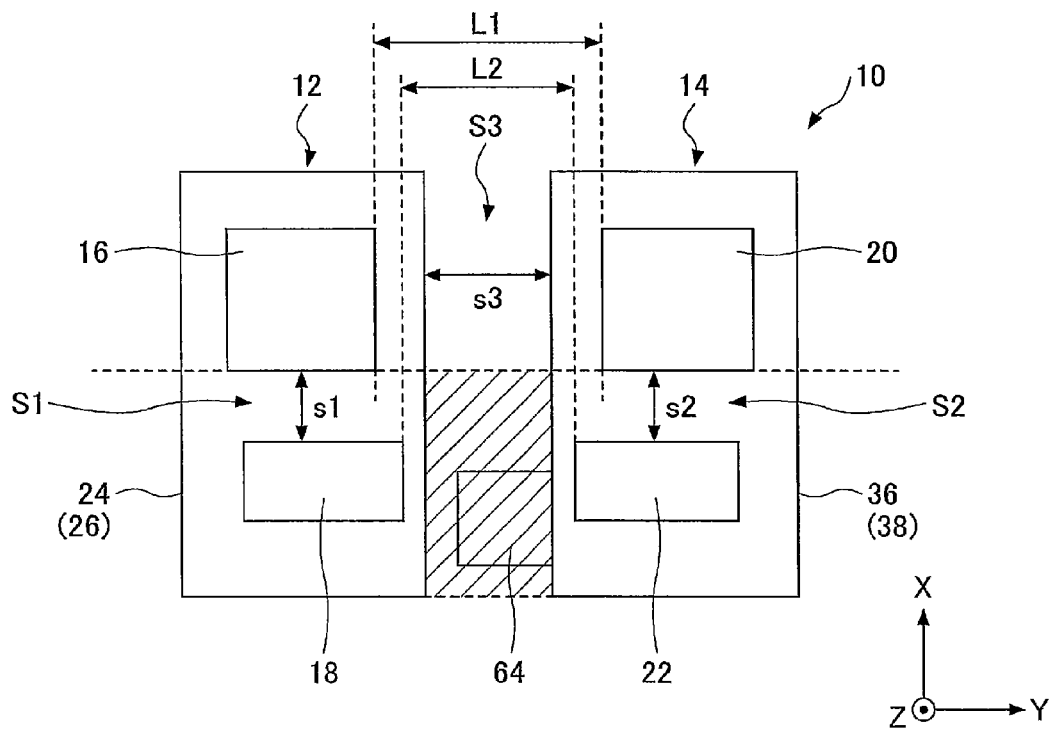
FIG. 5 is a plan view representing a positional relationship between a semiconductor element and a structure in a semiconductor device in the present embodiment.

FIG. 1 illustrates an external view of a semiconductor device 10 according to an embodiment of the present invention. FIG. 2 illustrates a circuit configuration diagram of the semiconductor device 10 in the present embodiment. FIG. 3 illustrates an exploded view of the semiconductor device 10 illustrated in FIG. 1. FIG. 4 illustrates a cross-sectional view of the semiconductor device 10 according to the present embodiment, taken along a line A-A illustrated in FIG. 1. Also, FIG. 5 illustrates a plan view representing a positional relationship between a semiconductor element and a structure in the semiconductor device 10 in the present embodiment. Note that FIG. 5 illustrates a state before seal resin fills the space.

The semiconductor device 10 in the present embodiment is built in, for example, a hybrid vehicle, an electric vehicle, or the like, and is a power semiconductor module used in a motor control apparatus such as an inverter to perform electric power conversion. The semiconductor device 10 has a mold structure having upper and lower arms united, and has a double-sided cooling structure to perform cooling on both the upper surface and the lower surface.

The semiconductor device 10 includes an upper arm power unit 12 that constitutes an upper arm to be connected with a high-potential power supply V+, and a lower arm power unit 14 that constitutes a lower arm to be connected with a low-potential power supply V−. The upper arm power unit 12 includes two different types of semiconductor elements 16 and 18. Also, the lower arm power unit 14 includes two different types of semiconductor elements 20 and 22. Each of the semiconductor elements 16-22 is configured with a semiconductor chip having a thin body and a rectangular shape.

The semiconductor elements 16 and 20 are power semiconductor switching elements such as insulated gate bipolar transistors (IGBT) to perform switching operations for electric power conversion, and the semiconductor elements 18 and 22 are freewheeling diodes that are required to flow back current when cutting off the semiconductor elements 16 and 20. In the following, the semiconductor elements 16 and 20 are referred to as the "semiconductor switching elements 16 and 20", and the semiconductor elements 18 and 22 are referred to as the "diodes 18 and 22", respectively.

In the semiconductor device 10, the diode 18 and the semiconductor switching element 16 are connected in parallel, and the diode 22 and the semiconductor switching element 20 are connected in parallel. The semiconductor switching element 16 and the semiconductor switching element 20 are connected in series between the high-potential power supply V+ and the low-potential power supply V−, and the diode 18 and the diode 22 are connected in series between the high-potential power supply V+ and the low-potential power supply V−. The upper arm power unit 12 includes the one semiconductor switching element 16 and the one diode 18 as two semiconductor elements 16 and 18. Also, the lower arm power unit 14 includes the one semiconductor switching element 20 and the one diode 22 as two semiconductor elements 20 and 22.

Each of the semiconductor switching elements 16 and 20 includes a collector electrode, an emitter electrode, and a gate electrode. In each of the semiconductor switching elements 16 and 20, the collector electrode is formed on one surface of the semiconductor chip, and the emitter electrode and the gate electrode are formed on the other surface of the semiconductor chip. Furthermore, in each of the diodes 18 and 22, a cathode electrode is formed on the one surface of the semiconductor chip, and an anode electrode is formed on the other surface of the semiconductor chip.

The upper arm power unit 12 includes lead frames 24 and 26 provided one on each surface of the semiconductor switching element 16 and the diode 18. The lead frames 24 and 26 are metal plates formed in a plane shape, and face each other. The semiconductor switching element 16 and the diode 18 of the upper arm power unit 12 are placed on the lead frames 24 and 26 (specifically, their die pad parts), and disposed to be sandwiched between the two lead frames 24 and 26. The die pad parts of the lead frames 24 and 26 have areas greater than the sizes (areas) of the semiconductor elements 16 and as semiconductor chips, respectively. The semiconductor switching element 16 and the diode 18 are placed side by side on the lead frames 24 and 26 having a predetermined gap S1 between them in the first direction X.

The one surface of the semiconductor switching element 16 and the one surface of the diode 18 face the lead frame 24. Also, the other surface of the semiconductor switching element 16 and the other surface of the diode 18 face the lead frame 26. The lead frames 24 and 26 are conductors made of metal, for example, copper, nickel or aluminum. Note that the lead frames 24 and 26 may have plating applied to their surfaces with silver or gold.

The one surface of the semiconductor switching element 16 and the one surface of diode 18 are bonded and fixed to the lead frame 24 via a bonding material 28. The bonding material 28 is solder made of, for example, tin, and has conductivity. The collector electrode of the semiconductor switching element 16 and the cathode electrode of diode 18 are electrically connected with the lead frame 24. In the following, the lead frame 24 is referred to as the "collector-side lead frame 24".

Also, the other surface of the semiconductor switching element 16 and the other surface of diode 18 are bonded and fixed to the lead frame 26 via a bonding material 30, a conductor block 32, and a bonding material 34. The bonding materials 30 and 34 are solder made of, for example, tin, and have conductivity. Also, the conductive block 32 is a conductor made of metal, for example, copper, and has the thickness in the stacked direction (thickness direction) Z. The emitter electrode of the semiconductor switching element 16 and the anode electrode of the diode 18 are electrically connected with the lead frame 26. In the following, the lead frame 26 is referred to as the "emitter-side lead frame 26".

The lower arm power unit 14 includes lead frames 36 and 38 provided one on each surface of the semiconductor switching element 20 and the diode 22. The lead frames 36 and 38 are metal plates formed in a plane shape, and face each other. The semiconductor switching element 20 and the diode 22 of the lower arm power unit 14 are placed on the lead frames 36 and 38 (specifically, their die pad parts), and disposed to be sandwiched between the two lead frames 36 and 38. The die pad parts of the lead frames 36 and 38 have areas greater than the sizes (areas) of the semiconductor elements 20 and 22 as semiconductor chips, respectively. The semiconductor switching element 20 and the diode 22 are placed side by side on the lead frames 36 and 38 having a predetermined gap S2 between them in the first direction X.

Note that the size of the predetermined gap S1 in the upper arm power unit 12 (the length s1 in the direction where the semiconductor elements 16 and 18 are arranged) is substantially the same as the size of the predetermined gap S2 in the lower arm power unit 14 (the length s2 in the direction where the semiconductor elements 20 and 22 are arranged).

The one surface of the semiconductor switching element 20 and the one surface of diode 22 face the lead frame 36. Also, the other surface of the semiconductor switching element 20 and the other surface of diode 22 face the lead frame 38. The lead frames 36 and 38 are conductors made of metal, for example, copper, nickel or aluminum. Note that the lead frames 36 and 38 may have plating applied to their surfaces with silver or gold, may be formed of the same metal as the lead frames 24 and 26, and may be cut off after having been formed with the lead frames 24 and 26 as a whole.

The one surface of the semiconductor switching element 20 and the one surface of the diode 22 are bonded and fixed to the lead frame 36 via a bonding material 40. The bonding material 40 is solder made of, for example, tin, and has conductivity. The collector electrode of the semiconductor switching element 20 and the cathode electrode of the diode 22 are electrically connected with the lead frame 36. In the following, the lead frame 36 is referred to as the "collector-side lead frame 36".

Also, the other surface of the semiconductor switching element 20 and the other surface of the diode 22 are bonded and fixed to the lead frame 38 via a bonding material 42, a conductor block 44, and a bonding material 46. The bonding materials 42 and 46 are solder made of, for example, tin, and have conductivity. Also, the conductive block 44 is a conductor made of metal, for example, copper, and has the thickness in the stacked direction (thickness direction) Z. The emitter electrode of the semiconductor switching element 20 and the anode electrode of the diode 22 are electrically connected with the lead frame 38. In the following, the lead frame 38 is referred to as the "emitter-side lead frame 38".

In the semiconductor device 10, the upper arm power unit 12 and the lower arm power unit 14 are molded so that the collector-side lead frame 24 of the upper arm power unit 12 and the collector-side lead frame 36 of the lower arm power unit 14 face each other having a gap S3 in the second direction Y, and the emitter-side lead frame 26 of the upper arm power unit 12 and the emitter-side lead frame 38 of the lower arm power unit 14 face each other having the gap S3 in the second direction Y. In this regard, the upper surface of the collector-side lead frame 24 of the upper arm power unit 12 and the upper surface of the collector-side lead frame 36 of the lower arm power unit 14 are positioned at the same height, and the lower surface of the emitter-side lead frame 26 of the upper arm power unit 12 and the lower surface of the emitter-side lead frame 38 of the lower arm power unit 14 positioned at the same height.

The collector-side lead frame 24 of the upper arm power unit 12 has the high-potential connection terminal 50 to be connected with the high-potential power supply V+, through which the voltage of the high-potential power supply V+ is applied. Also, the emitter-side lead frame 38 of the lower arm power unit 14 has the low-potential connection terminal 52 to be connected with the low-potential power supply V−, through which the voltage of the low-potential power supply V− is applied. The collector-side lead frame 36 of the lower arm power unit 14 has an output terminal 54 to be connected with a load.

The gate electrode of the semiconductor switching element 16 of the upper arm power unit 12 is connected with a control terminal 56 via a signal wire. The gate electrode of the semiconductor switching element 20 of the lower arm power unit 14 is connected with a control terminal 58 via a signal wire. These signal wires are bonding wires made of, for example, aluminum or copper. The control terminals 56 and 58 are provided at end parts on the side opposite to the side where the high-potential connection terminal 50, the low-potential connection terminal 52, and the output terminal 54 are provided in the upper arm power unit 12 and the lower arm power unit 14.

The control terminals 56 and 58 are connected with an electronic control unit (ECU) having a microcomputer as a main component. The gate electrodes of the semiconductor switching elements 16 and 20 have control signals supplied from the ECU via the control terminals 56 and 58 and the signal wires, respectively. Note that the size of the control terminals 56 and 58 may be smaller or greater than the size of the high-potential connection terminal 50, the low-potential connection terminal 52, and the output terminal 54 through which a larger current may flow.

In the upper arm power unit 12, the semiconductor elements 16 and 18 are sandwiched to be held between the two lead frames 24 and 26 that face each other in the stacked direction Z. Also, in the lower arm power unit 14, the semiconductor elements 20 and 22 are sandwiched to be held between the two lead frames 36 and 38 that face each other in the stacked direction Z. Namely, the upper arm power unit 12 and the lower arm power unit 14 have predetermined thicknesses in the stacked direction Z, respectively, which are substantially the same.

The upper arm power unit 12 and the lower arm power unit 14 are disposed in parallel in the second direction Y. Specifically, they are disposed in parallel in the second direction Y perpendicular to the first direction X and the thickness direction Z where the semiconductor switching element 16 and the diode 18 are arranged side by side having the predetermined gap S1 in the first direction X on the lead frames 24 and 26 in the upper arm power unit 12, and the semiconductor switching element 20 and the diode 22 are arranged side by side having the predetermined gap S2 in the first direction X on the lead frames 36 and 38 in the lower arm power unit 14.

Note that the upper arm power unit 12 and the lower arm power unit 14 are disposed so that the semiconductor switching elements 16 and 20 are disposed to face each other in the second direction Y; the diodes 18 and 22 are disposed to face each other in the second direction Y; and the predetermined gap S3 is formed between both (the length of the gap S3 in the second direction Y is s3). Also, the gaps S1 and S2 face each other in the second direction Y where the power units 12 and 14 are arranged. Here, the gap S1 is formed in the first direction X between the semiconductor elements 16 and 18 in the upper arm power unit 12, and the gap S2 is formed in the first direction X between the semiconductor elements 20 and 22 in the lower arm power unit 14.

The emitter-side lead frame 26 of the upper arm power unit 12 and the collector-side lead frame 36 of the lower arm power unit 14 are connected with each other via a joint 60. The joint 60 is provided in the gap S3 (specifically, a part of it) between the upper arm power unit 12 and the lower arm power unit 14 in the second direction Y. The joint 60 is constituted with an emitter portion 62 connected with the emitter-side lead frame 26 of the upper arm power unit 12; a collector portion 64 connected with the collector-side lead frame 36 of the lower arm power unit 14; and a bonding material 66 to bond the emitter portion 62 with the collector portion 64.

The emitter portion 62 and the collector portion 64 are conductors made of metal for example, copper, nickel, or aluminum. The emitter portion 62 has a cross-sectional structure obliquely extending like stairs from an end part of the emitter-side lead frame 26 of the upper arm power unit 12 to an end part of the collector-side lead frame 36 of the lower arm power unit 14. Also, the collector portion 64 has a cross-sectional structure horizontally extending from an end part of the collector-side lead frame 36 of the lower arm power unit 14 to an end part of the collector-side lead frame 24 of the upper arm power unit 12. Note that the emitter portion 62 or the collector portion 64 may be formed with the emitter-side lead frame 26 or the collector-side lead frame 36 as a whole. The bonding material 66 is solder made of, for example, tin, and has conductivity.

The semiconductor device 10 has a mold structure where the upper arm power unit 12 and the lower arm power unit 14, which are arranged in parallel in the second direction Y, are included as a whole by resin sealing. The semiconductor device 10 includes a resin part 70 to contain the upper arm power unit 12 and the lower arm power unit 14 as a whole by resin sealing.

The resin part 70 is made of, for example, epoxy resin, and the resin sealing is performed by injecting the resin in a melted state into a die containing the upper arm power unit 12 and the lower arm power unit 14. The injection of melted resin into the die to form the resin part 70 is performed starting from around the center in the second direction Y on a side where the control terminals 56 and 58 of the two power units 12 and 14 are provided (namely, the side where the bonding wires are provided to connect the control terminals 56 and 58 with the gate electrodes of the semiconductor switching elements 16 and 20), and expanding in the first direction X.

Note that the resin sealing of the resin part 70 is performed so that parts of the high-potential connection terminal 50, the low-potential connection terminal 52, the output terminal 54, and the control terminals 56 and 58 are included. Therefore, other parts of the high-potential connection terminal 50, the low-potential connection terminal 52, the output terminal 54, and the control terminals 56 and 58 protrude from the main body side (the side surrounded by the resin part 70) of the semiconductor device 10 to be exposed externally.

Also, the resin sealing of the resin part 70 is performed so that surfaces of the lead frames 24, 26, 36, and 38 opposite to the surfaces bonded with the semiconductor elements 16-22 are exposed externally. Therefore, the surfaces of the lead frames 24, 26, 36, and 38 opposite to the surfaces bonded with the semiconductor elements 16-22 are exposed externally. The surfaces of the lead frames 24, 26, 36, and 38 opposite to the surfaces bonded with the semiconductor elements 16-22 have heat sinks attached adjacent to each other. Thus, cooling is performed on both the upper and lower surfaces of the upper arm power unit 12 and the lower arm power unit 14.

Figure 6:
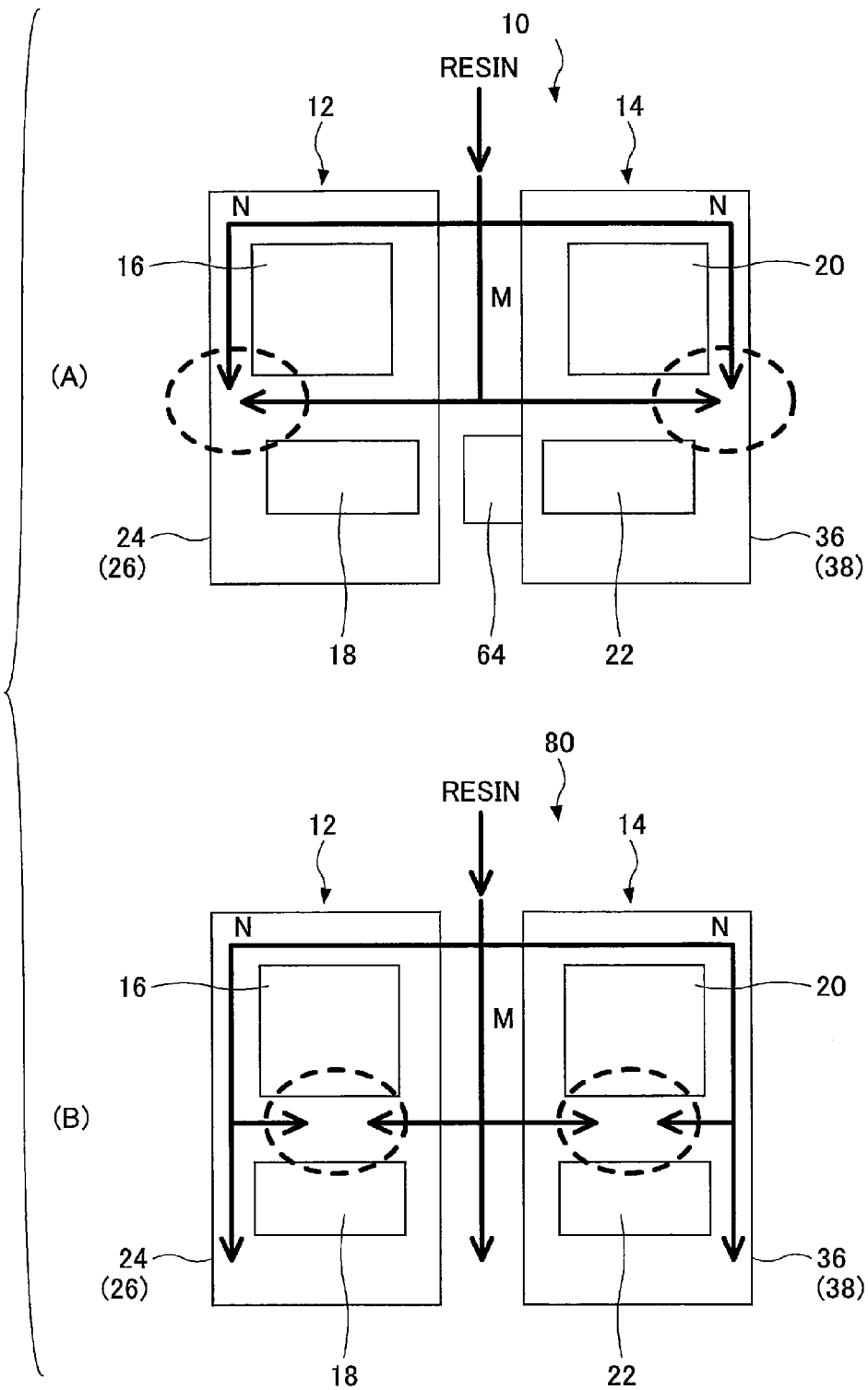
FIGS. 6(A)-6(B) are diagrams illustrating an effect obtained by a semiconductor device in the present embodiment.

FIGS. 6(A)-6(B) are diagrams illustrating an effect obtained by the semiconductor device 10 in the present embodiment. FIG. 6(A) illustrates a diagram representing a flow of resin when molding is performed for the semiconductor device 10 in the present embodiment. Also, FIG. 6(B) illustrates a diagram representing a flow of resin when molding is performed for a contrastive semiconductor device 80, which is compared with the semiconductor device 10 in the present embodiment.

In the semiconductor device 10 in the present embodiment, the upper arm power unit 12 and the lower arm power unit 14 have the respective predetermined thicknesses in the stacked direction Z. The semiconductor elements 16 and 18 are sandwiched to be held between the two lead frames 24 and 26, and the semiconductor elements 20 and 22 are sandwiched to be held between the two lead frames 36 and 38. Also, the upper arm power unit 12 and the lower arm power unit 14 are disposed in parallel having the predetermined gap S3 in the second direction Y in a state where the semiconductor switching element 16 and the diode 18 are arranged side by side having the predetermined gap S1 in the first direction X, and the semiconductor switching element 20 and the diode 22 are arranged side by side having the predetermined gap S2 in the first direction X.

In the present embodiment, molding of the resin part 70 is performed by having the main body side of the semiconductor device 10 included in the die, and then, injecting melted resin into the die from the side where the control terminals 56 and 58 of the power units 12 and 14 are provided. When injecting resin in this way, flows M and N of the resin exist in the die: the flow M of the resin that flows in the gap S3 between the upper arm power unit 12 and the lower arm power unit 14; and the flow N of the resin that flows the outer side of the upper arm power unit 12 (namely, the gap between the upper arm power unit 12 and the die), and the outer side of the lower arm power unit 14 (namely, the gap between the lower arm power unit 14 and the inner wall of the die).

Also, a part of the resin based on the flow M and a part of the resin based on the flow N reach the die at the end, part on the side where the high-potential connection terminal 50, the low-potential connection terminal 52, and the output terminal 54 of the power units 12 and 14 are provided, and other parts flow in the gaps S1 and S2 between the semiconductor switching elements 16 and 20, and the diodes 18 and 22 of the power units 12 and 14.

In this case, as shown in FIG. 6(B), the contrastive semiconductor device 80 has no structure in the gap S3 between the upper arm power unit 12 and the lower arm power unit 14. When resin is injected at a resin inlet of the semiconductor device 10 or the die, the resin flows through the gap S3 without facing any obstructions in the first direction X from the side where the control terminals 56 and 58 of the power units 12 and 14 are provided, to the side where the high-potential connection terminal 50, the low-potential connection terminal 52, and the output terminal 54 are provided. Therefore, the resin based on the flow M hardly flows through the gaps S1 and S2 formed in the power units 12 and 14, respectively. Therefore, in the structure of the contrastive semiconductor device 80, a part of the resin based on the flow M and a part of the resin based on the flow N tend to be confluent in the gaps S1 and S2 (regions enclosed by dashed lines in FIG. 6(B)), and as a result, the likelihood becomes higher for generation of resin void and resin delamination.

In contrast to this, the semiconductor device 10 in the present embodiment includes the joint 60 in the gap S3 between the upper arm power unit 12 and the lower arm power unit 14 to connect both the power units 12 and 14 with each other as described above.

This joint 60 is sealed by resin along with the upper arm power unit 12 and the lower arm power unit 14 as a whole. The joint 60 has a role of a connection part to connect the emitter-side lead frame 26 of the upper arm power unit 12 with the collector-side lead frame 36 of the lower arm power unit 14. Furthermore, when manufacturing the semiconductor device 10, the joint 60 has a role to prevent the resin that flows in at the resin inlet of the semiconductor device 10 or the die from flowing towards the side where the high-potential connection terminal 50, the low-potential connection terminal 52, and the output terminal 54 are provided, as a structure formed in the passage where the resin flows between both the power units 12 and 14 (specifically, a region where the semiconductor elements 16 and 18, and the semiconductor elements 20 and 22 are separated).

Figure 7:
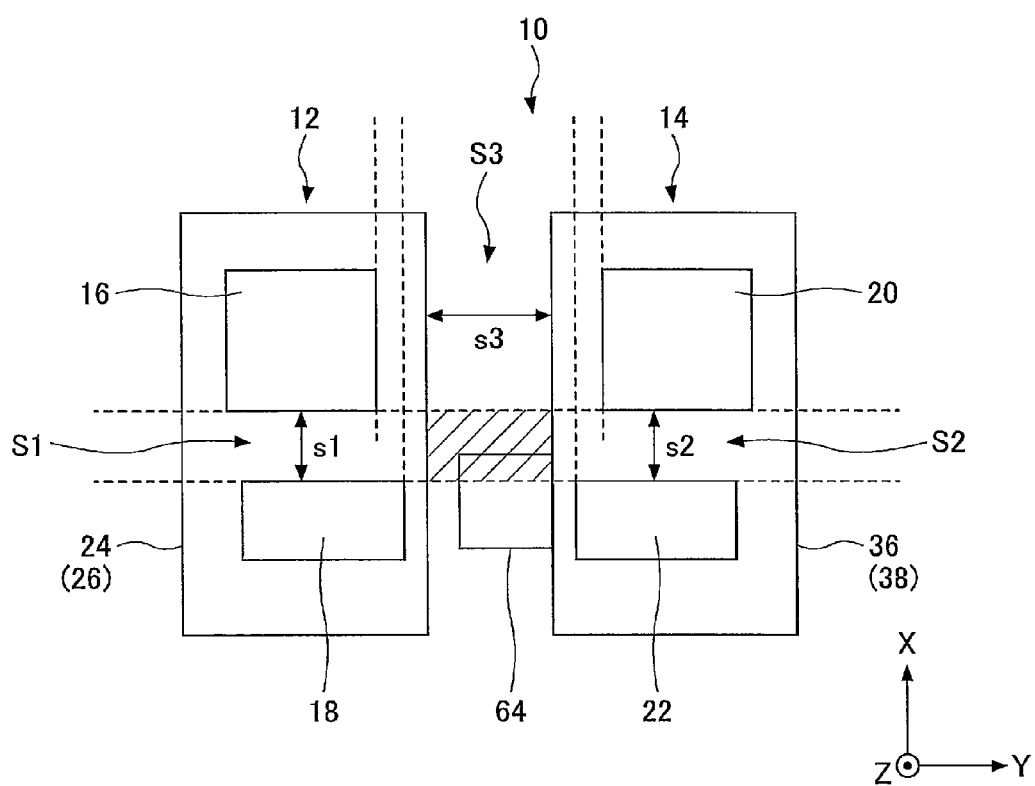
FIG. 7 is a plan view representing a positional relationship between a semiconductor element and a structure in a semiconductor device in a modified example of the present invention.

As shown in FIG. 5 and FIG. 6(A), the joint 60 (the collector portion 64) is disposed as shown in FIG. 7 so that its end part (specifically, the end part on the side of the resin inlet, or the side where the control terminals 56 and 58 are provided, at which resin is injected to form the resin part 70 when manufactured or molded) is positioned in the gap S3 on the passage between the upper arm power unit 12 and the lower arm power unit placed in parallel in the second direction Y. More specifically, the joint 60 is positioned at a location corresponding to an end part of the semiconductor element 16 opposite to the other end part on the side of the resin inlet of the semiconductor element 16, which is on the side of the resin inlet among the two semiconductor elements 16 and 18 placed having the gap S1 between them. The location also corresponds to an end part of the semiconductor element 20 opposite to the other end part on the side of the resin inlet of the semiconductor element 20, which is on the side of the resin inlet among the two semiconductor elements 20 and 22 placed having the gap S2 between them (namely, a downstream location in the resin flow direction, or a region having slant lines in FIG. 5).

Note that it is more preferable to dispose the joint 60 as shown in FIG. 7 so that its end part (specifically, the end part, on the side of the resin inlet, or the side where the control terminals 56 and 58 are provided, at which resin is injected to form the resin part 70 when manufactured or molded) is positioned within a positional range (region having slant lines in FIG. 7) corresponding to the gap S1 between the semiconductor elements 16 and 18 and the gap S2 between the semiconductor elements 20 and 22 in the gap S3. Also, in this case, it is even preferable to have the end part of the joint 60 positioned at a downstream location within the positional range (closer to the diodes 18 and 22).

Also, there is no structure in the gap S3 between the upper arm power unit 12 and the lower arm power unit 14, in a range from the resin inlet side to the end part of the joint 60. In this case, a stem of resin is not generated for the resin that flows in the first direction X before the resin that flows in at the resin inlet of the die reaches the joint 60 in the gap S3. The stem of the resin is generated once the resin reaches the joint 60.

When the joint 60 is placed as described above, a part of the resin that flows into the gap S3 from the resin inlet of the semiconductor device 10 or the die is stemmed by the end part of the joint 60 on the side of the resin inlet. Therefore, the resin hardly flows through the gap S3 to the side where the high-potential connection terminal 50, the low-potential connection terminal 52, and the output terminal 54 are provided. On the other hand, the resin tends to flow into the gap S1 between the semiconductor elements 16 and 18, and the gap S2 between the semiconductor elements 20 and 22.

Also, the joint 60 connects both the power units 12 and 14 in the gap S3 between the upper arm power unit 12 and the lower arm power unit 14. Specifically, the joint 60 connects the emitter-side lead frame 26 of the upper arm power unit 12 with the collector-side lead frame 36 of the lower arm power unit 14 in the gap S3. In this case, the joint 60 is disposed in the gap S3 so that it is included in a positional range that corresponds to a region between the lower surface of the emitter-side lead frame 26 of the upper arm power unit 12 (or the lower surface of the emitter-side lead frame 38 of the lower arm power unit 14) and the upper surface of the collector-side lead frame 36 of the lower arm power unit 14 (or the upper surface of the collector-side lead frame 24 of the upper arm power unit 12).

Placing the joint 60 in this way, the resin tends to flow into the space between the upper surface of the lead frames 24 and 36, and the lower surface of the lead frames 26 and 38 of the power units 12 and 14 when the resin flows into the gaps S1 and S2 due to the stem at the end part of the joint 60 on the side of the resin inlet.

Therefore, compared to the structure of the contrastive semiconductor device 80, in the structure of the semiconductor device 10 in the present embodiment, the resin flowing in the gap S3 has a comparatively greater flow speed when flowing into the gaps S1 and S2. This makes the resin take comparatively shorter time to reach the outer sides of the power units 12 and 14 in the second direction Y (gaps to the inner wall of the die, or regions enclosed by dashed lines in FIG. 6(A)) after flowing into the gaps S1 and S2 and passing through the gaps S1 and S2.

Also, in the semiconductor device 10 in the present embodiment, among the two semiconductor elements 16 and 18 in the upper arm power unit 12, the diode 18 positioned on the far side from the resin inlet, at which the resin is injected during manufacturing, is disposed to project towards the gap S3 relative to the end part on the gap S3 side of the semiconductor switching element 16 positioned on the near side of the resin inlet. Also, similarly, among the two semiconductor elements 20 and 22 in the lower arm power unit 14, the diode 22 positioned on the far side from the resin inlet, at which the resin is injected during manufacturing, is disposed to project towards the gap S3 relative to the end part on the gap S3 side of the semiconductor switching element 20 positioned on the near side of the resin inlet.

Namely, the diodes 18 and 22 positioned on the far side from the resin inlet of the power units 12 and 14 are disposed to project towards sides where both the diodes 18 and 22 are closer to each other in the second direction Y where the power units 12 and 14 are separated, compared to the semiconductor switching elements 16 and 20 positioned on the near sides from the resin inlet. In this case, both the diodes 18 and 22 function as structures to prevent the resin that flows in at the resin inlet from flowing through downstream in the first direction X in the gap S3 on the passage between the two power units 12 and 14.

In the above structure, a first clearance L1 between the semiconductor switching element 16 of the upper arm power unit 12 and the semiconductor switching element 20 of the lower arm power unit 14 in the second direction Y, differs from a second clearance L2 between the diode 18 of the upper arm power unit 12 and the diode 22 of the lower arm power unit 14 in the second direction Y. Specifically, the second clearance L2 between the diodes 18 and 22 positioned on the far side from the resin inlet is smaller than the first clearance L1 between the semiconductor switching elements 16 and 20 positioned on the near side from the resin inlet.

In the upper arm power unit 12, assuming that the width of the semiconductor switching element 16 in the second direction Y is substantially the same as the width of the diode 18 in the second direction Y, the center position of the semiconductor switching element 16 in the second direction Y and the center position of the diode 18 in the second direction Y are offset to each other in the second direction Y.

Specifically, on the lead frames 24 and 26, the diode 18 positioned at a downstream location in the resin flowing direction during resin injection is placed closer to the gap S3 than the semiconductor switching element 16 positioned at an upstream location. The end part of the diode 18 on the side in the second direction Y (more specifically, the gap S3 side in the second direction Y) is positioned closer to the gap S3 than the end part of the semiconductor switching element 16 on the side in the second direction Y (more specifically, the gap S3 side in the second direction Y).

Also, in the lower arm power unit 14, assuming that the width of the semiconductor switching element 20 in the second direction Y is substantially the same as the width of the diode 22 in the second direction Y, the center position of the semiconductor switching element 20 in the second direction Y and the center position of the diode 22 in the second direction Y are offset to each other in the second direction Y.

Specifically, on the lead frames 36 and 38, the diode 22 positioned at a downstream location in the resin flowing direction during resin injection is placed closer to the gap S3 than the semiconductor switching element 20 positioned at an upstream location. The end part of the diode 22 on the side in the second direction Y (more specifically, the gap S3 side in the second direction Y) is positioned closer to the gap S3 than the end part of the semiconductor switching element 20 on the side in the second direction Y (more specifically, the gap S3 side in the second direction Y).

In the structure of the semiconductor device 10, the passage width of the resin injected at the resin inlet of the semiconductor device 10 or the die is greater at the upstream location (specifically, the location where the semiconductor switching elements 16 and 20 face each other in the second direction Y), and is less at the downstream location (specifically, the location where the diodes 18 and 22 face each other in the second direction Y). Therefore, when the resin injected at the resin inlet flows between the power units 12 and 14 (namely, the gap S3), a part of the resin is stemmed at the end parts (the upper ends in FIG. 5) of the diodes 18 and 22 on the side in the first direction X after passing through between the semiconductor switching elements 16 and 20.

Therefore, in the structure in the present embodiment, compared to a structure in which resin is not stemmed by the end parts (the upper ends in FIG. 5) of the diodes 18 and 22 on the side of the first direction X, the resin that flows in the gap S3 between both the power units 12 and 14 hardly flows through the gap S3 to the side where the high-potential connection terminal 50, the low-potential connection terminal 52, and the output terminal 54 are provided. On the other hand, as the resin tends to flow into the gap S1 between the semiconductor elements 16 and 18, and the gap S2 between the semiconductor elements 20 and 22, the resin has a comparatively greater flow speed when flowing into the gaps S1 and S2. This makes the resin take comparatively shorter time to reach the outer sides of the power units 12 and 14 in the second direction Y (gaps to the inner wall of the die, or regions enclosed by dashed lines in FIG. 6(A)) after flowing into the gaps S1 and S2 and passing through the gaps S1 and S2.

Therefore, according to the semiconductor device 10, when melted resin is injected into the die in the neighborhood of the center on the side where the control terminals 56 and 58 of the power units 12 and 14 are provided while the semiconductor device 10 is being manufactured, it is possible to make a part of the resin flowing through the gap S3 based on the flow M, which flows into the gaps S1 and S2, be confluent with a part of the resin based on the flow N at positions on outer sides of the power units 12 and 14 in the second direction Y after passing through the gaps S1 and S2, instead of at internal positions in the gaps S1 and S2.

Thus, according to the semiconductor device 10 in the present embodiment, when molding is performed with resin, it is possible to make it hard for the resin to be confluent in the gap S1 between the two semiconductor elements 16 and 18 of the upper arm power unit 12, and in the gap S2 between the two semiconductor elements 20 and 22 of the lower arm power unit 14. Therefore, it is possible to suppress generation of resin void and generation of resin delamination in the semiconductor device 10.

Note that, in the above embodiment, the lead frames 24, 26, 36, and 38 correspond to "metal plates" described in the claims; the semiconductor elements 16-22 correspond to "semiconductor elements" described in the claims; the gaps S1 and S2 correspond to "predetermined gaps" described in the claims; the second direction Y corresponds to a "predetermined direction" described in the claims; the upper arm power unit 12 and the lower arm power unit 14 correspond to "power units" described in the claims; the semiconductor switching elements 16 and 20 correspond to "closer semiconductor elements" described in the claims; the diodes 18 and 22 correspond to "distant semiconductor elements" described in the claims; the joint 60 and the diodes 18 and 22 correspond to "structures" described in the claims; the lead frames 26 and 38 correspond to a "lead frame" and an "upper surface side lead frame" described in the claims; the lead frames 24 and 36 correspond to a "lead frame" and a "lower surface side lead frame" described in the claims; the first clearance L1 corresponds to a "first clearance" described in the claims; the second clearance L2 corresponds to a "second clearance" described in the claims.

Figure 8:
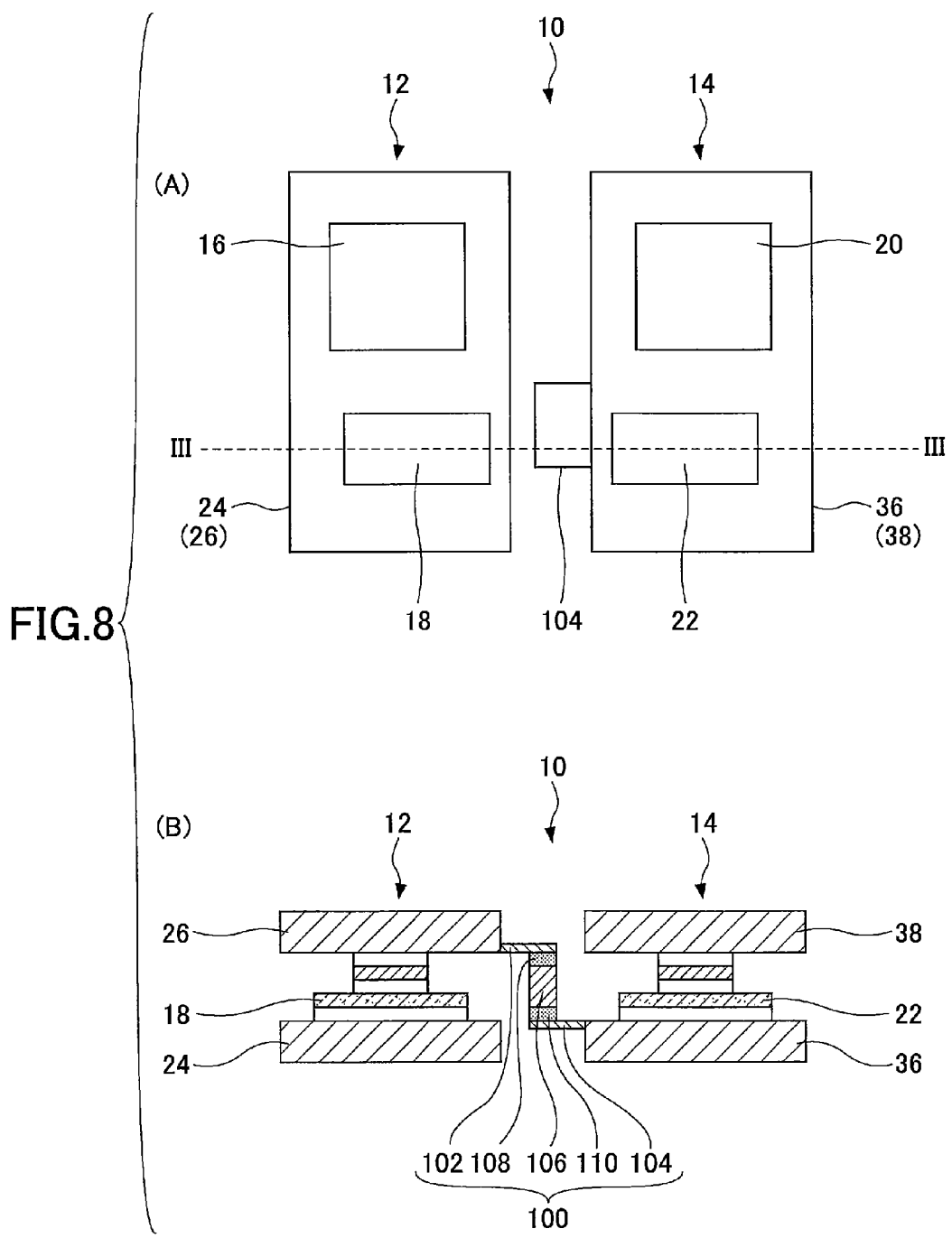
FIGS. 8(A)-8(B) are configuration diagrams of a semiconductor device according to a modified example of the present invention.

Incidentally, in the above embodiment, as shown in FIG. 4, the joint 60 connecting the upper arm power unit 12 with the lower arm power unit 14 is formed so that it obliquely extends like stairs from the end part of the emitter-side lead frame 26 of the upper arm power unit 12 to the end part of the collector-side lead frame 36 of the lower arm power unit 14. Alternatively, as shown in FIG. 8(B), a joint 100 connecting the upper arm power unit 12 with the lower arm power unit 14 is formed so that the thickness in the stacked direction Y in the gap S3 becomes greater. Note that FIG. 8(A) illustrates a view of a positional relationship between semiconductor elements and a structure in a semiconductor device of a modified example, and FIG. 8(B) illustrates a cross-sectional view of the semiconductor device in the modified example, taken along the line in FIG. 8(A).

In this modified example, the joint 100 is constituted with an emitter portion 102 connected with an emitter-side lead frame 26 of the upper arm power unit 12; a collector portion 104 connected with the collector-side lead frame 36 of the lower arm power unit 14; a conductive block 106 that is a conductor made of metal, for example, copper, and has the thickness in the stacked direction (thickness direction) Z; a bonding material 108 to bond the emitter portion 102 with the conductive block 106; and a bonding material 110 to bond the conductive block 106 with the collector portion 104. The structure of the joint 100 in the modified example has a sufficient thickness in the stacked direction Z as a structure to stem resin in the gap S3 on the passage between both the power units 12 and 14. Therefore, it is easier to stem the resin, to accelerate the resin to flow into the gaps S1 and S2 from the gap S3.

Figure 9:
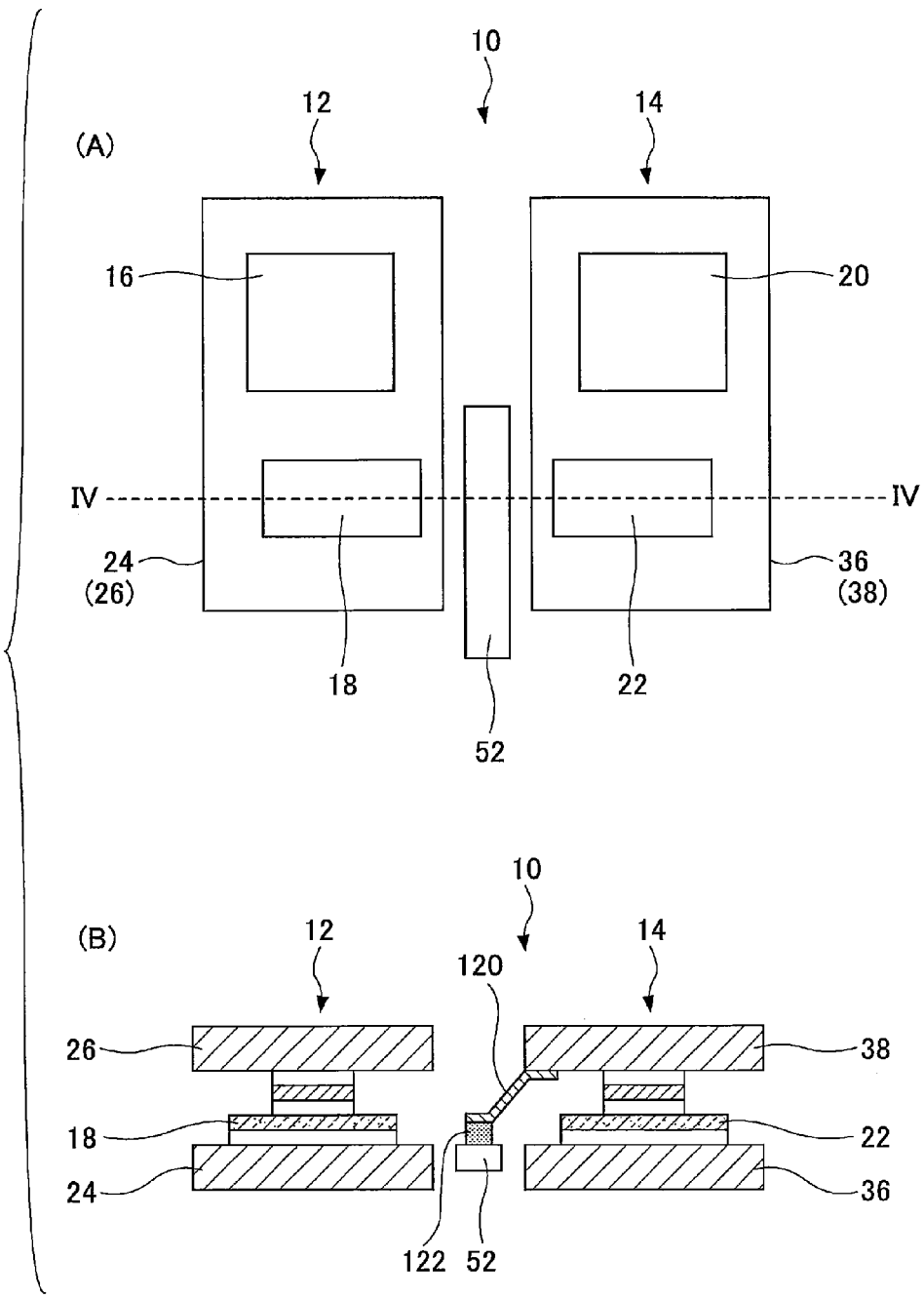
FIGS. 9(A)-9(B) are configuration diagrams of a semiconductor device according to a modified example of the present invention.

Also, in the above embodiment, the joint 60, which connects the emitter-side lead frame 26 of the upper arm power unit 12 with the collector-side lead frame 36 of the lower arm power unit 14, is used as the structure to stem the resin in the gap S3 between both the power units 12 and 14. However, embodiments of the present invention are not restricted to that, but the emitter-side lead frame 38 of the lower arm power unit 14 or the low-potential connection terminal 52 connected with emitter-side lead frame 38 may be used as the structure. In this modified example, as shown in FIG. 9(B), an emitter portion 120 connected with an emitter-side lead frame 38 may be bonded to a low-potential connection terminal 52 by a bonding material 122. Note that FIG. 9(A) illustrates a view of a positional relationship between semiconductor elements and the structure in a semiconductor device of the modified example, and FIG. 9(B) illustrates a cross-sectional view of the semiconductor device in the modified example, taken along the line IV-IV in FIG. 9(A).

Also, in the above embodiment, the semiconductor switching elements 16 and 20 are placed on the resin inlet side and the diodes 18 and 22 are placed on the other side on the lead frames 24, 26, 36, and 38 of the power units 12 and 14. Alternatively, the diodes 18 and 22 are placed on the resin inlet side and the semiconductor switching elements 16 and 20 are placed on the other side.

In the structure of this modified example, the semiconductor switching elements 16 and 20 positioned on the far side from the resin inlet of the power units 12 and 14 are disposed to project towards sides where both the semiconductor switching elements 16 and 20 are closer to each other in the second direction Y where the power units 12 and 14 are separated, compared to the diodes 18 and 22 positioned on the near side from the resin inlet. Namely, a clearance between the semiconductor switching elements 16 and 20 positioned on the far side from the resin inlet is smaller than a clearance between the diodes 18 and 22 positioned on the near side from the resin inlet. Also, on the lead frames 24 and 26, the semiconductor switching element 16 is placed closer to the gap S3 than the diode 18, and on the lead frames 36 and 38, the semiconductor switching element 20 is placed closer to the gap S3 than the diode 22.

Also, in the above embodiment, to stem resin in the gap S3 between both the power units 12 and 14, the relevant elements are positioned as follows: (1) the joint 60 connecting both the power units 12 and 14 is positioned so that its end part on the side of the resin inlet is positioned at a downstream position in the flow direction of the resin, compared to the end part on the downstream side of the semiconductor switching elements 16 and 20 that is positioned upstream in the gap S3, and more preferably, within a positional range corresponding to the gap S1 between the semiconductor elements 16 and 18 and the gap S2 between the semiconductor elements 20 and 22 in the gap S3; and (2) the diodes 18 and 22 positioned on the far side from the resin inlet of the power units 12 and 14 are disposed to project towards sides where both the diodes 18 and 22 are closer to each other in the second direction Y where the power units 12 and 14 are separated, compared to the semiconductor switching elements 16 and 20 positioned on the near side from the resin inlet. Alternatively, it may be sufficient to satisfy one of these conditions.

Also, in the above embodiment, the upper arm power unit 12 includes the two semiconductor elements 16 and 18 and the lower arm power unit 14 includes the two semiconductor elements 20 and 22. Alternatively, power units 12 and 14 may include three or more semiconductor elements, respectively.

Figure 10:
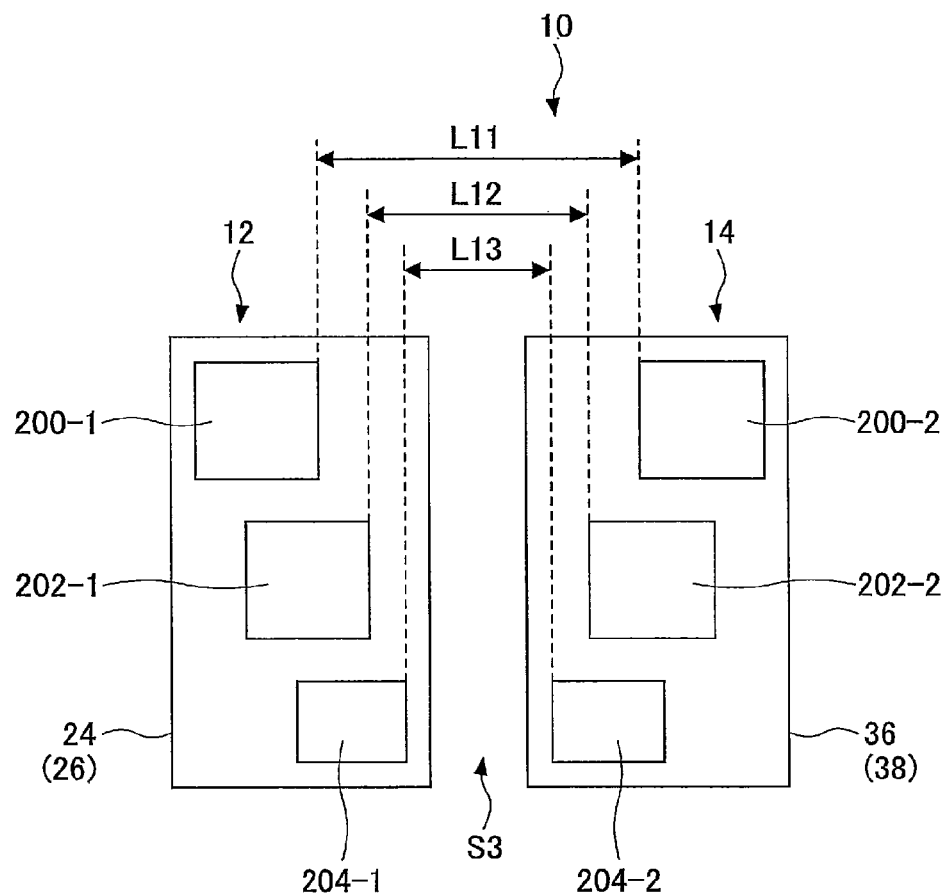
FIG. 10 is a configuration diagram of a semiconductor device according to a modified example of the present invention.

For example, as shown in FIG. 10, power units 12 and 14 may include three semiconductor elements 200, 202, and 204, respectively. These semiconductor elements 200, 202, and 204 are disposed on the power units 12 and 14 in the first direction X having gaps between them. Note that these three semiconductor elements 200, 202, and 204 may be different types, or may be the same two and a different one. For example, they may be two semiconductor switching elements and a diode, or conversely, one semiconductor switching element and two diodes.

In this modified example, among the three semiconductor elements 200, 202, and 204 in the power units 12 and 14, the semiconductor element 204 positioned on the far side from the resin inlet at which the resin is injected during manufacturing may be disposed to project towards the gap S3 relative to the end parts of the semiconductor elements 200 and 202 at the gap S3 side positioned closer to the side of the resin inlet. Also, among the two semiconductor elements 200 and 202, the semiconductor element 202 positioned at the relatively far side from the resin inlet may be disposed to project towards the gap S3 relative to the end part of the semiconductor element 200 at the gap S3 side positioned on the near side of the resin inlet.

Namely, a clearance L13 between the semiconductor elements 204 of the power units 12 and 14 positioned on the farthest side from the resin inlets is smaller than a clearance L12 between the semiconductor elements 202 positioned at an intermediate distance from the resin inlet, and the clearance L12 is smaller than a clearance L11 between the semiconductor elements 200 positioned at the nearest side from the resin inlet. Also, assuming that the widths of the semiconductor elements 200, 202, and 204 in the second direction Y are substantially the same, the center positions of the semiconductor elements 200, 202, and 204 in the second direction Y are offset to each other in the second direction Y towards the gap S3 side.

In the structure of the modified example, the passage width of the resin injected at the resin inlet of the semiconductor device 10 or the die gets smaller when the resin flows from upstream to downstream. Therefore, when the resin injected at the resin inlet flows between the power units 12 and 14, a part of the resin is stemmed at the end parts (the upper ends in FIG. 10) of the semiconductor elements 202 in the first direction X after passing through between the semiconductor elements 200. Also, when the resin flows between the power units 12 and 14, a part of the resin is stemmed at the end parts (the upper ends in FIG. 10) of the semiconductor elements 204 in the first direction X after passing through between the semiconductor elements 202.

Therefore, in the structure having the three semiconductor elements included in the power units 12 and 14, respectively, the resin that flows into the gap S3 between the power units 12 and 14 tends to flow into the gaps between the semiconductor elements 200 and the semiconductor elements 202, which makes it hard for the resin to be confluent in the gaps.

Figure 11:
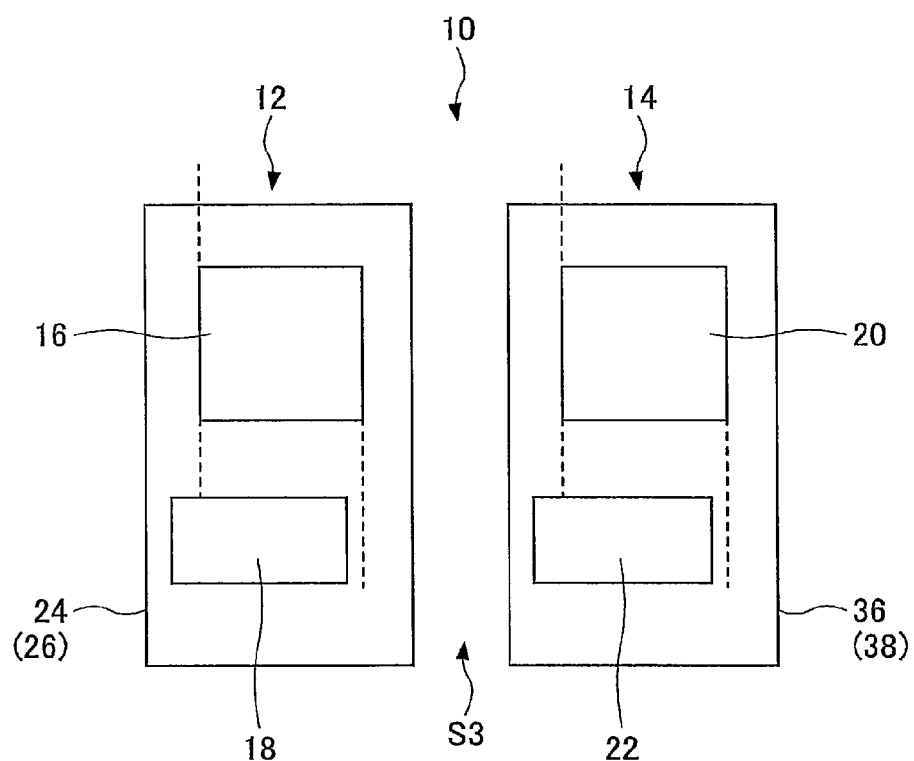
FIG. 11 is a configuration diagram of a semiconductor device according to a modified example of the present invention.

Also, in the above embodiment, the diodes 18 and 22 positioned on the far side from the resin inlet of the power units 12 and 14 are disposed to project towards sides where both the diodes 18 and 22 are closer to each other in the second direction Y where the power units 12 and 14 are separated, compared to the semiconductor switching elements 16 and 20 positioned on the near side from the resin inlet. Alternatively, as shown in FIG. 11, only one of the diodes 18 and 22 may be disposed to project towards the side where the one of the diodes 18 and 22 is shifted closer to the other in the second direction Y where the power units 12 and 14 are separated, compared to the semiconductor switching elements 16 and 20.

Note that, in the above embodiment, injection of resin into the die to form the resin part 70 is performed starting from an end part in the second direction Y on the side where the control terminals 56 and 58 of the two power units 12 and 14 are provided, and expanding in the first direction X. Alternatively, injection may be performed starting from an end in the second direction Y on the side where the control terminals 56 and 58 of the two power units 12 and 14 are provided, and expanding in the first direction X.

Figure 12:
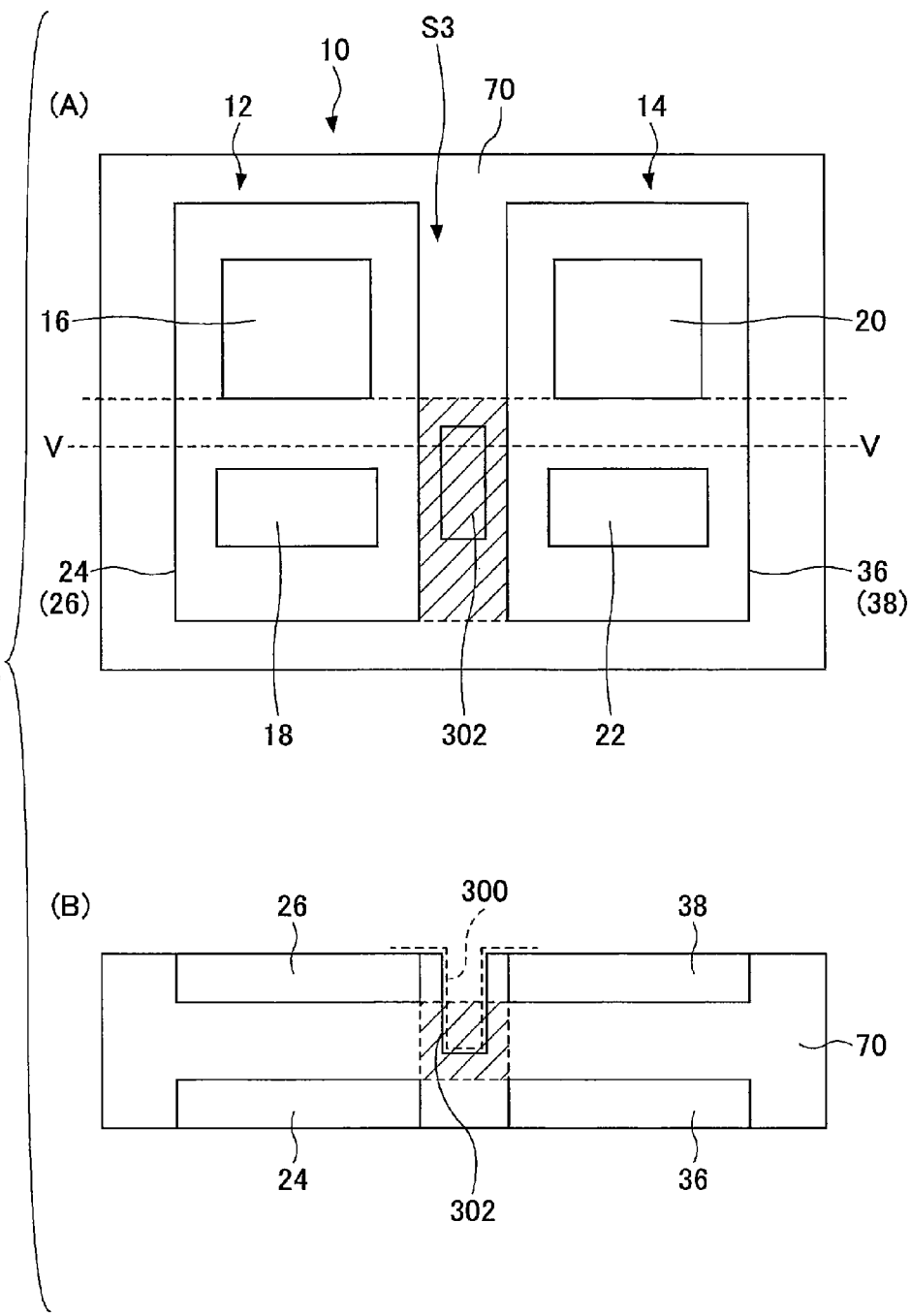
FIGS. 12(A)-12(B) are configuration diagrams of a semiconductor device according to a modified example of the present invention.

Also, in the above embodiment, the resin part 70 containing the upper arm power unit 12 and the lower arm power unit 14 as a whole by resin sealing, and the diodes 18 and 22 positioned on the far side from the resin inlet are used as the structure to stem the resin in the gap S3 between both the power units 12 and 14. However, embodiments of the present invention are not restricted to that. In addition to the joint 60 and the diodes 18 and 22, or instead of the joint 60 and the diodes 18 and 22, as shown in FIG. 12(B), a pin 300 disposed on the die may be used, which does not have resin sealing applied for power units 12 and 14 as a whole. Note that FIG. 12(A) illustrates a view of a positional relationship between semiconductor elements and the structure in a semiconductor device of the modified example, and FIG. 12(B) illustrates a cross-sectional view of the semiconductor device in the modified example, taken along the line V-V in FIG. 12(A).

In this modified example, the pin 300 is disposed on the die as a united part of it, and positioned so that its end part on the side of the resin inlet is positioned at a downstream position in the flow direction of the resin, compared to the end part on the downstream side of the semiconductor switching elements 16 and 20 that is positioned upstream in the gap S3, and more preferably, within a positional range (region having slant lines in FIG. 12(A)) corresponding to the gap S1 between the semiconductor elements 16 and 18 and the gap S2 between the semiconductor elements 20 and 22 in the gap S3. Also, this pin 300 is disposed in the gap S3 to include at least a part of a positional range (region having slant lines in FIG. 12(B)) that corresponds to a region between the lower surface of the emitter-side lead frames 26 and 38 and the upper surface of the collector-side lead frames 24 and 36 of the power units 12 and 14. Note that, in this case, it is more preferable that the pin 300 is positioned as a whole to be included in the positional range.

In the structure of the modified example, when manufacturing the semiconductor device 10, a part of the resin that flows into the gap S3 from the resin inlet is stemmed by the end part of the pin 300 on the side of the resin inlet. Therefore, the resin hardly flows through downstream in the first direction X, and tends to flow into the gap S1 between the semiconductor elements 16 and 18, and the gap S2 between the semiconductor elements 20 and 22. When flowing into the gaps S1 and S2, the resin tends to flow into the space between the upper surface of the lead frames 24 and 36 and the lower surface of the lead frames 26 and 38 of the power units 12 and 14. Thus, substantially the same effect as the above embodiment can be obtained in the modified example. Note that, in this modified example, after the injection of the resin, a concavity 302 is formed on the surface of the semiconductor device 10 that corresponds to the pin 300.

Also, in the above embodiment, the joint 60 is used as the structure to stem the resin in the gap S3 between both the power units 12 and 14. However, embodiments of the present invention are not restricted to that, but it may be sufficient to dispose a structure to prevent the resin from flowing on a passage of the resin between the two power units 12 and 14. For example, such a structure may be provided separately from the semiconductor elements 16-22 on the lead frames 24, 26, 36, and 38 of the power units 12 and 14.

Also, in the above embodiment, the semiconductor device 10 includes the two power units 12 and 14 placed in parallel in the second direction Y. Alternatively, the semiconductor device 10 may include three or more power units placed in parallel in the second direction Y.

Furthermore, in the above embodiment, the semiconductor device 10 has the double-sided cooling structure to perform cooling on both the upper surface and the lower surface in a state where the semiconductor elements 16-22 are sandwiched to be held between the two lead frames 24 and 26 facing each other, and between the two lead frames 36 and 38 facing each other. Alternatively, the semiconductor device 10 may have a single-sided cooling structure to perform cooling on a single surface.

This application is based upon and claims the benefit of priority of the prior Japanese Priority Application No. 2012-

050992 filed on Mar. 7, 2012, the entire contents of which are hereby incorporated by reference.

DESCRIPTION OF REFERENCE SYMBOLS 10 semiconductor device
12 upper arm power unit
14 lower arm power unit
16, 20 semiconductor switching elements (semiconductor elements)
18, 22 diodes (semiconductor elements)
24, 26, 36, 38 lead frames
50 high-potential connection terminal
52 low-potential connection terminal
54 output terminal
56, 58 control terminals
60 joint
70 resin part

The invention claimed is:

1. A semiconductor device comprising:
a plurality of power units configured to be placed in parallel in a predetermined direction, and integrally sealed with resin, wherein each of the power units includes a plurality of semiconductor elements placed on a metal plate having predetermined gaps with each other,
wherein two of the power units placed adjacent to each other in the predetermined direction have a passage therebetween through which the resin flows injected during manufacturing,
wherein the semiconductor elements of each of the two power units include a near-sided semiconductor element that is closer to an inlet of the resin among the two semiconductor elements having the predetermined gap therebetween,
wherein a structure is positioned on a passage and downstream in a resin flow direction relative to a predetermined position that corresponds to end parts of the near-sided semiconductor elements such that the structure prevents the resin from flowing downstream in a resin flow direction, the end parts being on a side opposite to another side closer to the inlet,
wherein the structure is a joint to connect the two power units placed adjacent to each other in the predetermined direction, and to be integrally sealed with the resin, along with the power unit.

2. The semiconductor device as claimed in claim 1, wherein an end part of the joint on the side closer to the inlet is positioned downstream in the resin circulating direction relative to the predetermined position, in a region where the semiconductor elements are separated, between the two power units placed adjacent to each other in the predetermined direction.

3. A semiconductor device comprising:
a plurality of power units configured to be placed in parallel in a predetermined direction, and integrally sealed with resin, wherein each of the power units includes a plurality of semiconductor elements placed on a metal plate having predetermined gaps with each other,
wherein two of the power units placed adjacent to each other in the predetermined direction have a passage therebetween through which the resin flows injected during manufacturing,
wherein a structure is placed on the passage so that an end part of the structure on a side of the inlet is positioned in a positional range corresponding to the predetermined gap,
wherein the structure is a joint to connect the two power units placed adjacent to each other in the predetermined direction, and to be integrally sealed with the resin, along with the power unit.

4. The semiconductor device as claimed in claim 1, wherein the power unit includes an upper surface lead frame as the metal plate disposed on an upper side of the semiconductor elements, and a lower surface lead frame as the metal plate disposed on a lower side of the semiconductor elements,
wherein the joint is placed on the passage so that the structure includes at least a part of a positional range corresponding to a gap between a lower surface of the upper surface lead frame and an upper surface of the lower surface lead frame.

5. The semiconductor device as claimed in claim 1, wherein each of the power units includes lead frames as the metal plates disposed on both surfaces of the semiconductor elements,
wherein the joint is a member to connect the two power units placed adjacent to each other in the predetermined direction so that the lead frame on an upper surface of the semiconductor elements of one of the power units is connected with the lead frame on a lower surface of the semiconductor elements of another of the power units.

6. A semiconductor device comprising:
a plurality of power units configured to be placed in parallel in a predetermined direction, and integrally sealed with resin, wherein each of the power units includes a plurality of semiconductor elements placed on a metal plate having predetermined gaps with each other,
wherein two of the power units placed adjacent to each other in the predetermined direction have a passage therebetween through which the resin flows injected during manufacturing,
wherein the semiconductor elements of each of the two power units include a near-sided semiconductor element that is closer to an inlet of the resin among the two semiconductor elements having the predetermined gap therebetween,
wherein a structure is positioned on a passage and downstream in a resin flow direction relative to a predetermined position that corresponds to end parts of the near-sided semiconductor elements such that the structure prevents the resin from flowing downstream in a resin flow direction, the end parts being on a side opposite to another side closer to the inlet,
wherein the structure is a far-sided semiconductor element positioned on a far side from the inlet, disposed to project in the predetermined direction from the end part of the near-sided semiconductor element in the predetermined direction.

7. The semiconductor device as claimed in claim 6, wherein the far-sided semiconductor elements of the respective two power units placed adjacent to each other in the predetermined direction are disposed closer in the predetermined direction than the near-sided semiconductor elements so that the width of the passage is greater at a range facing the near-sided semiconductor elements in the predetermined direction, and smaller at a range facing the far-sided semiconductor elements in the predetermined direction.

8. The semiconductor device as claimed in claim 6, wherein the far-sided semiconductor elements of the respective two power units placed adjacent to each other in the predetermined direction are disposed to project in the predetermined direction so that the far-sided semi-conductor elements are closer to each other in the predetermined direction.

9. The semiconductor device as claimed in claim 6, wherein a first clearance between the near-sided semiconductor elements is set different from a second clearance between the far-sided semiconductor elements for the respective two power units placed adjacent to each other in the predetermined direction.

10. The semiconductor device as claimed in claim 9, wherein the second clearance is set smaller than the first clearance.

11. The semiconductor device as claimed in claim 6, wherein a center position of the near-sided semiconductor element in the predetermined direction and a center position of the far-sided semiconductor element in the predetermined direction are offset from each other in the predetermined direction, in each of the power units.

12. The semiconductor device as claimed in claim 1, wherein the power unit includes one power transistor and one freewheeling diode as the semiconductor elements.

13. A manufacturing method of a semiconductor device including a plurality of power units configured to be placed in parallel in a predetermined direction, and integrally sealed with resin, wherein each of the power units includes a plurality of semiconductor elements placed on a metal plate having predetermined gaps with each other, wherein two of the power units placed adjacent to each other in the predetermined direction have a passage therebetween through which the resin flows injected during manufacturing, wherein the semiconductor elements of each of the two power units include a near-sided semiconductor element that is closer to an inlet of the resin among the two semiconductor elements having the predetermined gap therebetween, the method comprising:

placing a joint as a structure on the passage to prevent the resin from flowing downstream in a resin flowing direction, wherein the structure is positioned downstream in the resin flowing direction relative to a predetermined position corresponding to an end part on a side opposite to another side closer to the inlet of the near-sided semiconductor element, wherein the joint is to connect the two power units placed adjacent to each other in the predetermined direction, and to be integrally sealed with the resin, along with the power unit; and injecting the resin.

14. A manufacturing method of a semiconductor device including a plurality of power units configured to be placed in parallel in a predetermined direction, and integrally sealed with resin, wherein each of the power units includes a plurality of semiconductor elements placed on a metal plate having predetermined gaps with each other, wherein two of the power units placed adjacent to each other in the predetermined direction have a passage therebetween through which the resin flows injected during manufacturing, the method comprising:

placing a joint on the passage so that an end part on a side of the inlet of the structure is positioned in a positional range corresponding to the predetermined gap, wherein the joint is to connect the two power units placed adjacent to each other in the predetermined direction, and to be integrally sealed with the resin, along with the power unit; and injecting the resin.

15. The manufacturing method of a semiconductor device as claimed in claim 13, wherein the power unit includes an upper surface lead frame as the metal plate disposed on an upper side of the semiconductor elements, and a lower surface lead frame as the metal plate disposed on a lower side of the semiconductor elements, the method comprising:

placing the joint on the passage so that the joint includes at least a part of a positional range corresponding to a gap between a lower surface of the upper surface lead frame and an upper surface of the lower surface lead frame; and injecting the resin.

* * * * *